(12) United States Patent
Sheperek et al.

(10) Patent No.: US 11,664,080 B2
(45) Date of Patent: *May 30, 2023

(54) BIN PLACEMENT ACCORDING TO PROGRAM-ERASE CYCLES

(71) Applicant: Micron Technology, Inc., Boise, ID (US)

(72) Inventors: Michael Sheperek, Longmont, CO (US); Mustafa N. Kaynak, San Diego, CA (US); Steven Michael Kientz, Westminster, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/551,042

(22) Filed: Dec. 14, 2021

(65) Prior Publication Data

US 2022/0108758 A1   Apr. 7, 2022

Related U.S. Application Data

(63) Continuation of application No. 16/948,688, filed on Sep. 29, 2020, now Pat. No. 11,217,320.

(60) Provisional application No. 62/706,387, filed on Aug. 13, 2020.

(51) Int. Cl.
| | |
|---|---|
| *G11C 16/34* | (2006.01) |
| *G11C 16/30* | (2006.01) |
| *G11C 16/26* | (2006.01) |
| *G11C 16/32* | (2006.01) |
| *G11C 16/14* | (2006.01) |

(52) U.S. Cl.
CPC .......... *G11C 16/3495* (2013.01); *G11C 16/14* (2013.01); *G11C 16/26* (2013.01); *G11C 16/30* (2013.01); *G11C 16/32* (2013.01); *G11C 16/3404* (2013.01)

(58) Field of Classification Search
CPC ..... G11C 16/3495; G11C 16/14; G11C 16/26; G11C 16/30; G11C 16/32; G11C 16/3404; G11C 11/5642
See application file for complete search history.

(56) References Cited

U.S. PATENT DOCUMENTS

| | | |
|---|---|---|
| 9,958,845 B2 | 5/2018 | Jung et al. |
| 11,029,890 B1 | 6/2021 | Parthasarathy et al. |
| 11,081,200 B1 | 8/2021 | Parthasarathy |
| 11,086,572 B1 | 8/2021 | Alhussien |
| 11,217,320 B1 * | 1/2022 | Sheperek .............. G11C 16/14 |
| 2012/0008414 A1 | 1/2012 | Katz et al. |

(Continued)

*Primary Examiner* — Jay W. Radke
(74) *Attorney, Agent, or Firm* — Lowenstein Sandler LLP

(57) ABSTRACT

A system includes a memory device having a plurality of dice and A processing device to perform operations, including determining a representative number of program-erase cycles performed across the plurality of dice. The operations further include tracking the representative number of program-erase cycles over time. The operations further include, in response to the representative number of program-erase cycles satisfying a first threshold criterion, adding an additional threshold voltage offset bin to a plurality of threshold voltage offset bins for the memory device, wherein each of the plurality of threshold voltage offset bins comprises a corresponding window of time after program of data to the memory device.

20 Claims, 11 Drawing Sheets

(56) References Cited

U.S. PATENT DOCUMENTS

| | | |
|---|---|---|
| 2018/0143762 A1 | 5/2018 | Kim et al. |
| 2019/0056981 A1 | 2/2019 | Shulkin et al. |
| 2019/0267100 A1 | 2/2019 | Shulkin et al. |
| 2021/0191617 A1 | 6/2021 | Sheperek et al. |
| 2021/0202028 A1 | 7/2021 | Choi et al. |

* cited by examiner

800

Superblock Table 810

| SuperBlock | Partition | Time Hr | Temp | Family |
|---|---|---|---|---|
| 0 | 0 | 10 | 31 | 4 |
| 0 | 1 | 11 | 35 | 5 |
| 0 | 2 | 11 | 50 | 20 |
| ... | ... | ... | ... | ... |
| 0 | 31 | | | |
| 1 | 0 | | | 20 |
| 1 | 1 | | | 21 |
| 1 | 2 | | | 0 |
| 1 | 3 | | | 0 |
| ... | ... | | | |
| 1 | 30 | | | 0 |
| 1 | 31 | | | 0 |
| ... | ... | | | 1 |
| ... | ... | | | 1 |
| ... | ... | | | 1 |
| 785 | 29 | | | 22 |
| 785 | 30 | | | 0 |
| 785 | 31 | | | 0 |

Family Table 820

| Index | Die 0 bin | Die 1 bin | ... | Die N bin |
|---|---|---|---|---|
| 1 | 5 | 6 | | 4 |
| 2 | 4 | 2 | | 5 |
| 3 | | | | |
| 4 | 3 | | | |
| 5 | | | | |
| ... | | | | |
| 20 | | | | |
| 21 | | | | |
| 22 | | | | |
| ... | | | | |
| 62 | | | | |
| 63 | | | | |
| 64 | | | | |

Offset table 830

| Bin | TLC1 | TLC2 | TLC3 | TLC4 | TLC5 | TLC6 | TLC7 | MLC1 | MLC2 | MLC3 | SLC |
|---|---|---|---|---|---|---|---|---|---|---|---|
| 1 | 0 | 1 | 1 | 1 | -2 | -3 | -4 | 0 | 2 | 2 | 2 |
| 2 | | | | | | | | | | | |
| 3 | | | | | | | | | | | |
| ... | | | | | | | | | | | |
| 64 | | | | | | | | | | | |

FIG. 8

BIN PLACEMENT ACCORDING TO PROGRAM-ERASE CYCLES

REFERENCE TO RELATED APPLICATION

This application is a continuation application of co-pending U.S. patent application Ser. No. 16/948,688, filed Sep. 29, 2020, which claims the benefit of U.S. Provisional Patent Application No. 62/706,387, filed Aug. 13, 2020, the entireties of which are incorporated herein by this reference.

TECHNICAL FIELD

Embodiments of the disclosure are generally related to memory sub-systems, and more specifically, are related to bin placement according to program-erase cycles.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

FIG. 8 is a graph that schematically illustrates metadata maintained by the memory sub-system controller operating in according with some embodiments.

DETAILED DESCRIPTION

Figure 1:
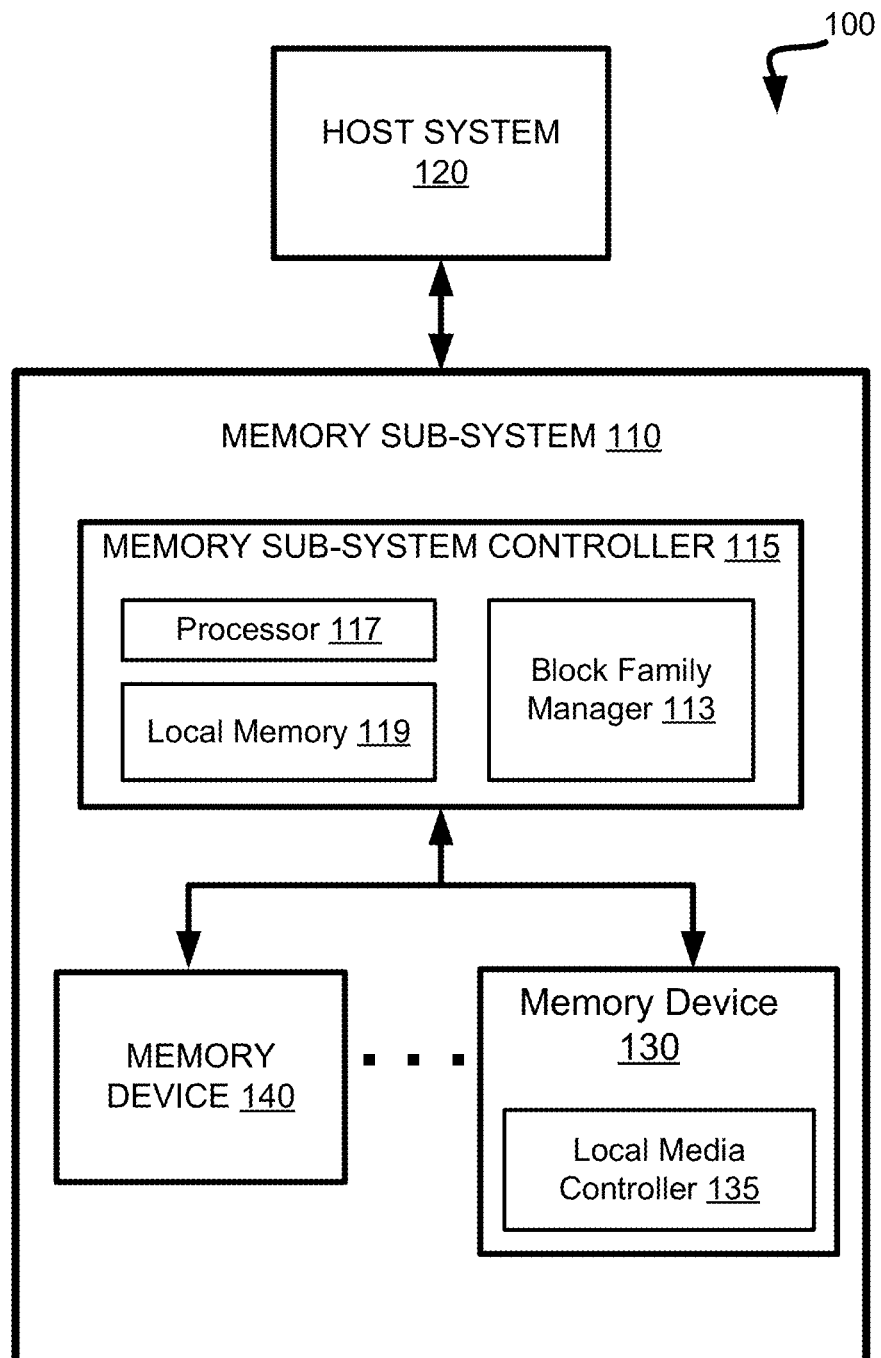
FIG. 1 illustrates an example computing system that includes a memory sub-system in accordance with some embodiments.

Embodiments of the present disclosure are directed to bin placement according to program-erase cycles. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by negative-and (NAND) type flash memory devices. Other examples of non-volatile memory devices are described below in conjunction with FIG. 1. A non-volatile memory device is a package of one or more dice. Each die can consist of one or more planes. Planes can be grouped into logic units (LUN). For some types of non-volatile memory devices (e.g., NAND devices), each plane consists of a set of physical blocks. A "block" herein refers to a set of contiguous or non-contiguous memory pages. An example of a block is an erasable block, which is a minimal erasable unit of memory, while a page is a minimal writable unit of memory. Each page includes a set of memory cells ("cells"). A cell is an electronic circuit that stores information.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, hereinafter is referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g., used to distinguish age of data written), valid bitmap (which LBAs or logical transfer units contain valid data), block family information, and the like.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information. "Threshold voltage" herein shall refer to the voltage level that defines a boundary between two neighboring voltage distributions corresponding to two logical levels. Thus, the read operation can be performed by comparing the measured voltage exhibited by the memory cell to one or more reference voltage levels in order to distinguish between two logical levels for single-level cells and between multiple logical levels for multi-level cells.

Due to the phenomenon known as slow charge loss, the threshold voltage of a memory cell changes in time as the electric charge of the cell is degrading, which is referred to as "temporal voltage shift" (TVS), since the degrading electric charge causes the voltage distributions to shift along the voltage axis towards lower voltage levels. The threshold voltage changes rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss can result in the increased bit error rate in read operations (or RBER). Various common implementations either fail to adequately address the temporal voltage shift or employ inefficient strategies resulting in high RBER and/or exhibiting other shortcomings.

Embodiments of the present disclosure address the above-noted and other deficiencies by implementing a memory sub-system that employs block family based error avoidance strategies, thus significantly improving the bit error rate exhibited by the memory sub-system. The TVS can be selectively tracked for a programmed set of memory cells grouped by block families, and appropriate voltage offsets, which are based on block affiliation with a certain block family, are applied to the base read levels in order to perform read operations. "Block family" herein shall refer to a possibly non-contiguous set of memory cells (which can reside in one or more full and/or partial blocks, the latter referred to as "partitions" herein) that have been programmed within a specified time window and a specified temperature window, and thus are expected to exhibit similar or correlated changes in their respective data state metrics. A block family can be made with any granularity, containing only whole codewords, whole pages, whole super pages, or whole superblocks, or any combination of these. "Data state metric" herein shall refer to a quantity that is measured or inferred from the state of data stored on a memory device. Specifically, the data state metrics can reflect the state of the temporal voltage shift, the degree of read disturb, and/or other measurable functions of the data state. A composite data state metric is a function (e.g., a weighted sum) of a set of component state metrics.

In these embodiments, the time window of a block family can vary depending on temperature and/or a number of program-erase cycles (PEC) associated with the block family, over time, while the block family is opened. Upon meeting certain criteria, such as passage of a particular amount of time at a certain aggregate temperature and/or number of PEC, the block family is closed. After closure, further programming to dice of the memory device is to a newly opened block family. Since the time elapsed after programming and temperature are the main factors affecting the TVS, all pages, blocks, and/or partitions within a single block family are presumed to exhibit similar distributions of threshold voltages in memory cells, and thus would require the same voltage offsets (or trims) to be applied to the base read levels for read operations. "Base read level" herein shall refer to the initial threshold voltage level exhibited by the memory cell immediately after programming. In some implementations, base read levels can be stored in the metadata of the memory device.

The memory sub-system controller can periodically perform a calibration process in order to associate each die of every block family with one of the predefined threshold voltage offset bins, which is in turn associated with the voltage offset to be applied for read operations. The association of pages or blocks with block families and block families and dies with threshold voltage offset bins can be stored in respective metadata tables maintained by the memory sub-system controller. Because TVS occurs to memory cells of block families, operating with static parameters that define the threshold voltage offset bins conventionally leads to higher RBER as time passes and PEC at the memory cells increase. The PEC of the memory cells refers to the number of times a group of memory cells is erased and subsequently programmed with new data.

For example, leaving the number of bins constant can cause scan-related performance loss of over-binning (e.g., having too many bins) at low PEC or under-binning (e.g., having too few bins) at high PEC, causing the memory device to have wide threshold voltage offset bins that show trigger margin loss at the edges of the bins. Trigger margin loss is loss of trigger margin, which is a ratio of bit error rate, at a critical trigger rate, and a maximum bit error rate that is correctable at that critical trigger rate. The critical trigger rate is a number of codewords that are not correctable when read outside of error handling. As a further example, leaving the location of the bins static can cause either the threshold voltage offset bins to be spread out too much at low PEC or to not cover the entire TVS range with high PEC.

To avoid these deficiencies from occurring, particularly in relation to reducing RBER, and according to various embodiments, the memory sub-system controller adjusts the number and/or the placement of the threshold voltage offset bins. In one embodiment, the controller tracks a representative number of program-erase cycles (PEC) over time across the dice of the memory device. The controller can add another threshold voltage offset bin to the existing threshold voltage offset bins in response to the representative number of PEC satisfying a first threshold criterion, such as being greater than a particular PEC value. The representative number of PEC, for example, can be an average, a median, mean or the like value for PEC calculated across the dice of the memory device. In one embodiment, the additional threshold voltage offset bin is tacked onto the older side of the number of existing threshold voltage offset bins.

In a further embodiment, the memory sub-system controller can instead or additionally, in response to the representative number of PEC satisfying the first threshold criterion, increase the threshold voltage offsets of the threshold voltage offset bins by a first amount (e.g., 10 to 30 millivolts, 31 to 60 millivolts, or the like). In this way, the controller adjusts the placement of the threshold voltage offsets associated with respective ones of the threshold voltage offset bins. In one embodiment, this magnitude adjustment to the threshold voltage offsets is performed to a representative read level (e.g., read level 7) of the memory cells and the remainder of the read levels are correspondingly adjusted with respect to that representative read level.

Upon receiving a read command, the memory sub-system controller can identify the block family associated with the page or block identified by the logical block address (LBA) specified by the read command, identify the threshold voltage offset bin associated with the block family and die on which the page or block resides, compute the new threshold voltage by additively applying the threshold voltage offset associated with the threshold voltage offset bin to the base read level, and perform the read operation using the new threshold voltage.

Therefore, advantages of the systems and methods implemented in accordance with some embodiments of the present disclosure include, but are not limited to, improving the bit error rate in read operations by maintaining metadata tracking groups of memory cells (as block families) that are presumed to exhibit similar voltage distributions and selectively performing calibration operations for limited subsets of memory cells based on their block family association. Further, because such tracking, storage, and calibration are performed on a block family basis as opposed to a per-block (or per-page) basis, processing, memory, and storage resources are preserved for host system usage. Other advantages will be apparent to those skilled in the art of memory allocation and error optimization within a memory sub-system discussed hereinafter.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs), can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), operatively coupled and configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every the data payload (e.g., user data) utilizes multiple dies of the memory devices 130 (e.g., NAND type flash memory devices), such that the payload is distributed through a subset of dies, while the remaining one or more dies are used to store the error correction information (e.g., parity bits). Accordingly, a set of blocks distributed across a set of dies of a memory device using a striping scheme is referred herein to as a "superblock."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a block family manager 113 that can be used to implement the block family-based error avoidance strategies in accordance with embodiments of the present disclosure. In some embodiments, the controller 115 includes at least a portion of the block family manager 113. For example, the controller 115 can include a processor 117 (processing device) configured to execute instructions stored in local memory 119 for performing the operations described herein. In some embodiments, the block family manager 113 is part of the host system 120, an application, or an operating system. The block family manager 113 can manage block families associated with the memory devices 130, as described in more detail herein below.

Figure 2:
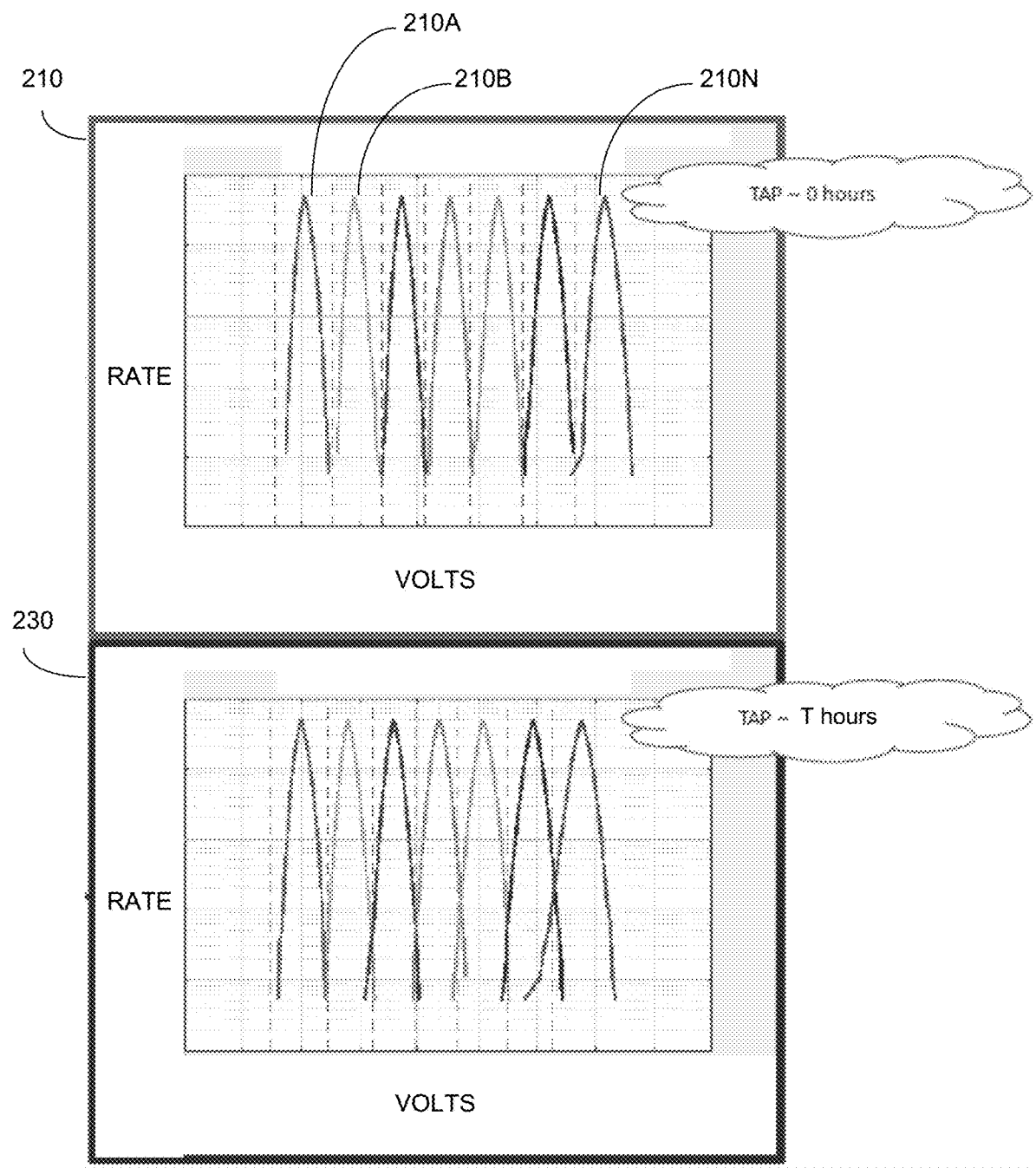
FIG. 2 is a set of graphs that illustrate a temporal voltage shift caused by the slow charge loss exhibited by triple-level memory cells, in accordance with some embodiments.

FIG. 2 is a set of graphs that illustrate a temporal voltage shift caused by the slow charge loss exhibited by triple-level memory cells, in accordance with some embodiments. While the illustrative example of FIG. 2 utilizes triple-level cells, the same observations can be made and, accordingly, the same remedial measures are applicable to single level cells and multi-level cells in order to compensate for the slow charge loss.

As noted herein above, a memory cell can be programmed (written to) by applying a certain voltage to the memory cell, which results in an electric charge being held by the memory cell, thus allowing modulation of the voltage distributions produced by the memory cell. Precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information.

In FIG. 2, each graph illustrates a voltage distribution 210A, 210B, . . . 210N produced by memory cells programmed by a respective write level (which can be assumed to be at the midpoint of the distribution) to encode a corresponding logical level ("000" through "111" in case of a TLC). In order to distinguish between neighboring distributions (corresponding to two different logical levels), the threshold voltage levels (shown by dashed vertical lines) are defined, such that any measured voltage that falls below a threshold level is associated with one distribution of the pair of neighboring distributions, while any measured voltage that is greater than or equal to the threshold voltage level is associated with another distribution of the pair of neighboring distributions.

The set of a graphs include a first graph 210 that reflects a time period immediately after programming and a second graph 230 that reflects a long time after programming. As seen by comparing the second graph 230 to the first graph 210, the voltage distributions 210A, 210B, . . . 210N change in time due to the slow charge loss, which results in drifting values of the threshold voltage levels (shown by dashed vertical lines). In various embodiments, this temporal voltage shift (TVS) is selectively tracked for programmed pages grouped by block families, and appropriate voltage offsets, which are based on page affiliation with a certain block family, are applied to the base read levels in order to perform read operations.

Figure 3:
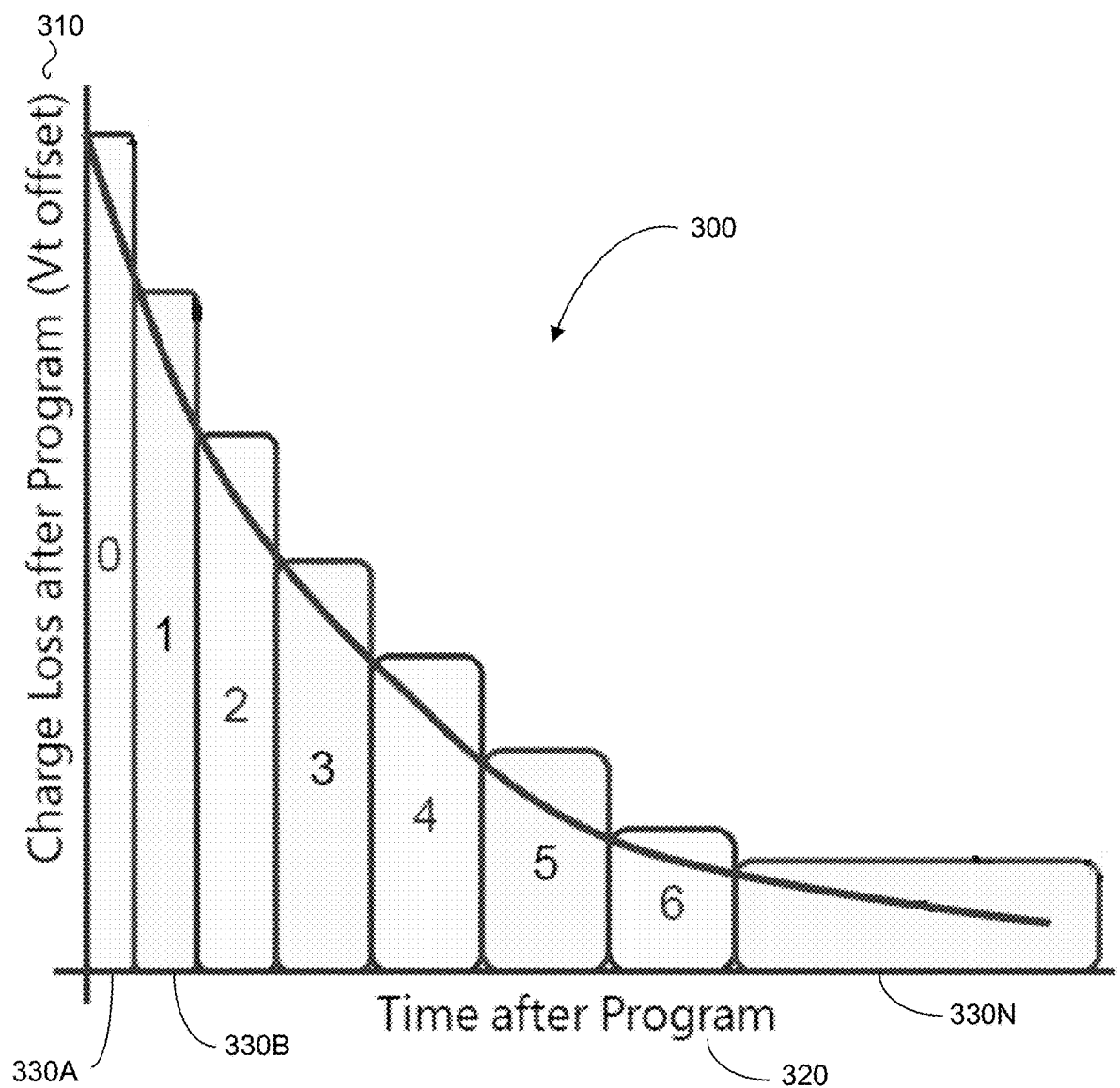
FIG. 3 is an example graph illustrating the dependency of a threshold voltage offset on the time after program, e.g., the period of time elapsed since a page had been programmed, in accordance with some embodiments.

FIG. 3 is an example graph 300 illustrating the dependency of a threshold voltage offset 310 on the time after program 320, e.g., the period of time elapsed since a page had been programmed, in accordance with some embodiments. As schematically illustrated by FIG. 3, pages or blocks (or groups of memory cells at another granularity) of the memory device are grouped into block families 330A-330N, such that each block family includes one or more pages or blocks that have been programmed within a specified time window (or window of time), potentially varied by aggregate temperature and/or PEC while the block family is open. As noted herein above, since the time elapsed after programming and temperature are the main factors affecting the temporal voltage shift, all pages, blocks, and/or partitions within a single block family are presumed to exhibit similar distributions of threshold voltages in memory cells, and thus would require the same voltage offsets for read operations as time passes.

Block families can be created asynchronously with respect to page programming events. In an illustrative example, the memory sub-system controller 115 of FIG. 1 can create a new block family whenever a specified period of time (e.g., a predetermined number of minutes) has elapsed since creation of the last block family, which time period can vary significantly depending on an aggregate temperature and/or PEC associated with pages during programming. More specifically, the entire asymptotic curve illustrated in FIG. 3 can be shifted to have a steeper curve with respect to time as aggregate temperature and/or PEC increases. Slow charge loss is illustrated along the vertical access for the seventh valley (V7) based on digital-to-analog (DAC) converted voltage values, also referred to as DACs. Each DAC can represent a certain number of millivolts (mV), here about 10 mV by way of example.

A newly created block family can be associated with bin 0, and each subsequently created block family can be associated with a sequentially numbered block family. Then, the memory sub-system controller can periodically perform a calibration process in order to associate each die of every block family with one of the predefined threshold voltage offset bins (e.g., bins 0-7 in the illustrative example of FIG. 3), which is in turn associated with the voltage offset to be applied for read operations. The associations of pages, blocks, and/or partitions with block families and block families and dies with threshold voltage offset bins can be stored in respective metadata tables maintained by the memory sub-system controller 115.

Figure 4A:
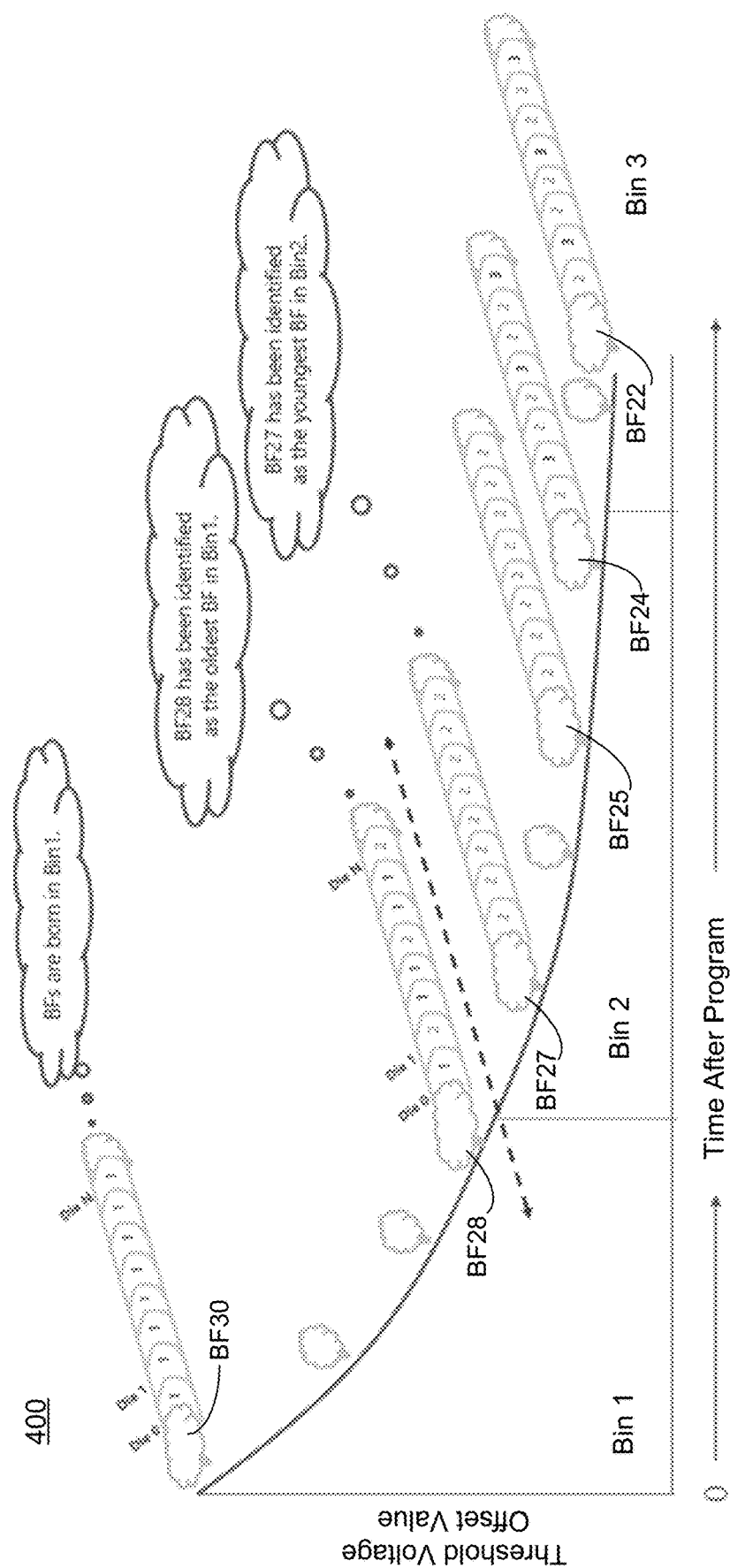
FIG. 4A is a graph illustrating how block families exist in a particular threshold voltage offset bin, which depends on time after program (TAP) in accordance to an embodiment.
Figure 4B:
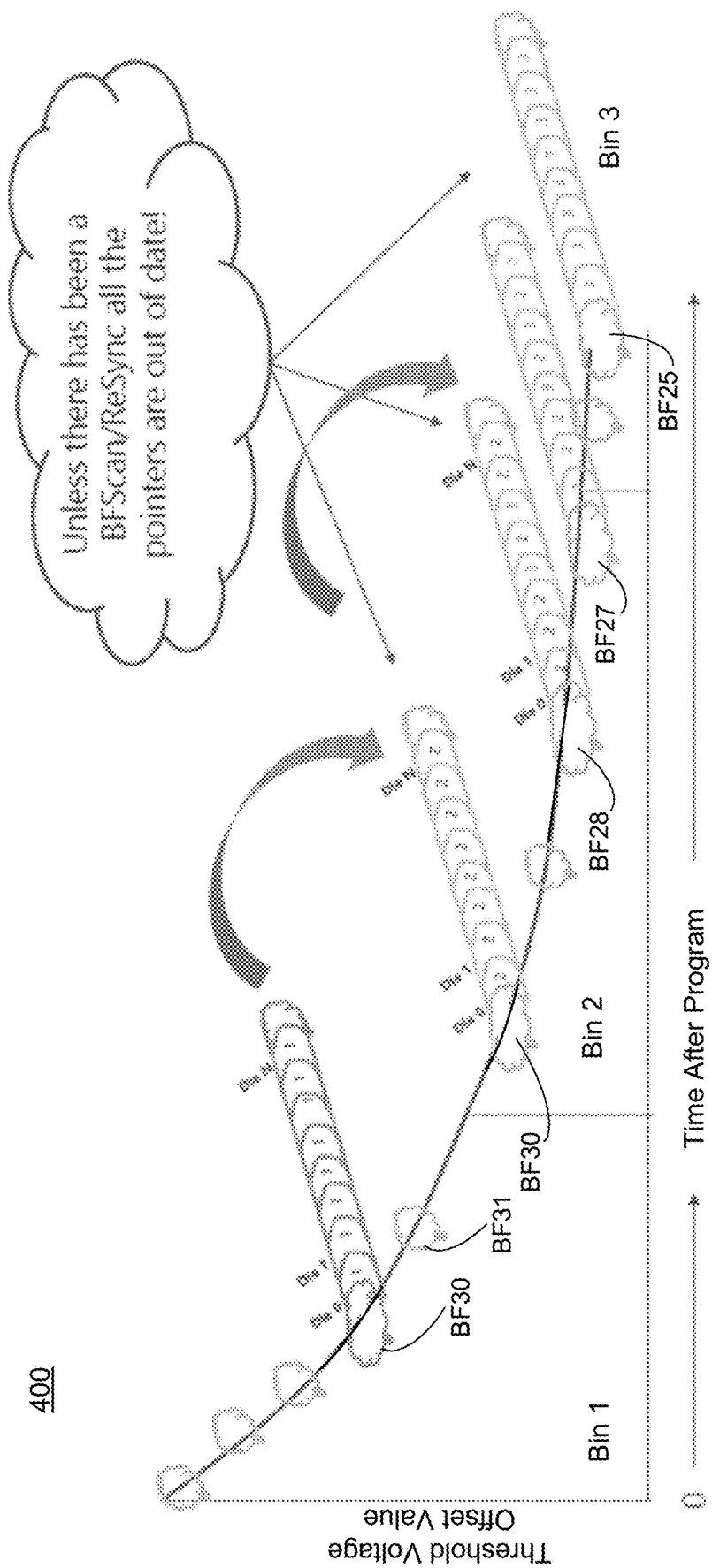
FIG. 4B is the graph illustrating how block families move to the right with increasing time after program (TAP) in accordance with an embodiment.

FIG. 4A is a graph 400 illustrating how block families exist in a particular threshold voltage offset bin, which depends on time after program (TAP) in accordance to an embodiment. FIG. 4B is the graph 400 illustrating how block families move to the right with increasing time after program (TAP) in accordance with an embodiment. In the example embodiment of FIG. 4A, block families (BFs) are born in the first threshold voltage offset bin (Bin 1 for short), and age over time to transition to being associated (or re-identified) with a subsequent threshold voltage offset bin. The drift in TVS (which is along the Y axis in the graph 400) starts more quickly with respect to TAP and thus has a steeper curve at first and slows down later, leveling out this curve.

As illustrated in FIG. 4A, BF28 is identified as the oldest block family in Bin 1 because at least a part of the data in BF28 is still within the time after program (TAP) defined by Bin 1. Further, BF30 has just been created (e.g., closed as a BF) and is the youngest block family in Bin 1. Similarly, BF27 is identified as the youngest block family in the second threshold voltage offset bin (Bin 2) and BF24 as the oldest block family in Bin 2. Further, BF22 is old enough to reside now in the third threshold voltage offset bin (Bin 3). While many threshold voltage offset bins can exist, the embodiment of FIG. 4A illustrates three bins solely for purposes of explanation, each of which is associated with one or more threshold voltage offset values.

As is evidenced in FIG. 4B, the block families generally drift in threshold voltage offset over time, where BF28 and BF30 are both now in Bin 2, BF25 is in Bin 3, and new block families BF31 and younger BFs are located in Bin 1. Due to the fact that block families are drifting over time with respect to the threshold voltage offset value, the block family manager 113 can perform a scan of the memory cells of the memory device (e.g., to measure TVS levels) and a resynchronization of pointers of the block families based on the measured TVS levels. The scanning can be limited to the block families that exist at the boundaries between threshold voltage offset bins (e.g., BF24 and BF28 as viewed in FIG. 4A) and are thus anticipated to be the first to move into a new bin. Depending on frequency of scanning, one or more BFs that have recently transitioned into new bins can also be measured and their bin pointers resynchronized. Resynchronization of pointers refers to updating pointers between metadata tables that tell the controller 115 which threshold voltage offset bin to use for which block families and thus, ultimately, which threshold voltage offset values to apply for which block families (see FIG. 8).

The principles disclosed herein can provide a portion of intelligent modification to threshold voltage offset bin TAP boundaries and/or threshold voltage offset values within the respective bins based on levels of PEC for the respective block families. In this way, the extra burden on resources needed to perform BF scans can be reduced, e.g., the block family manager 113 no longer has to always scan every BF to update the metadata table pointers.

Figure 5:
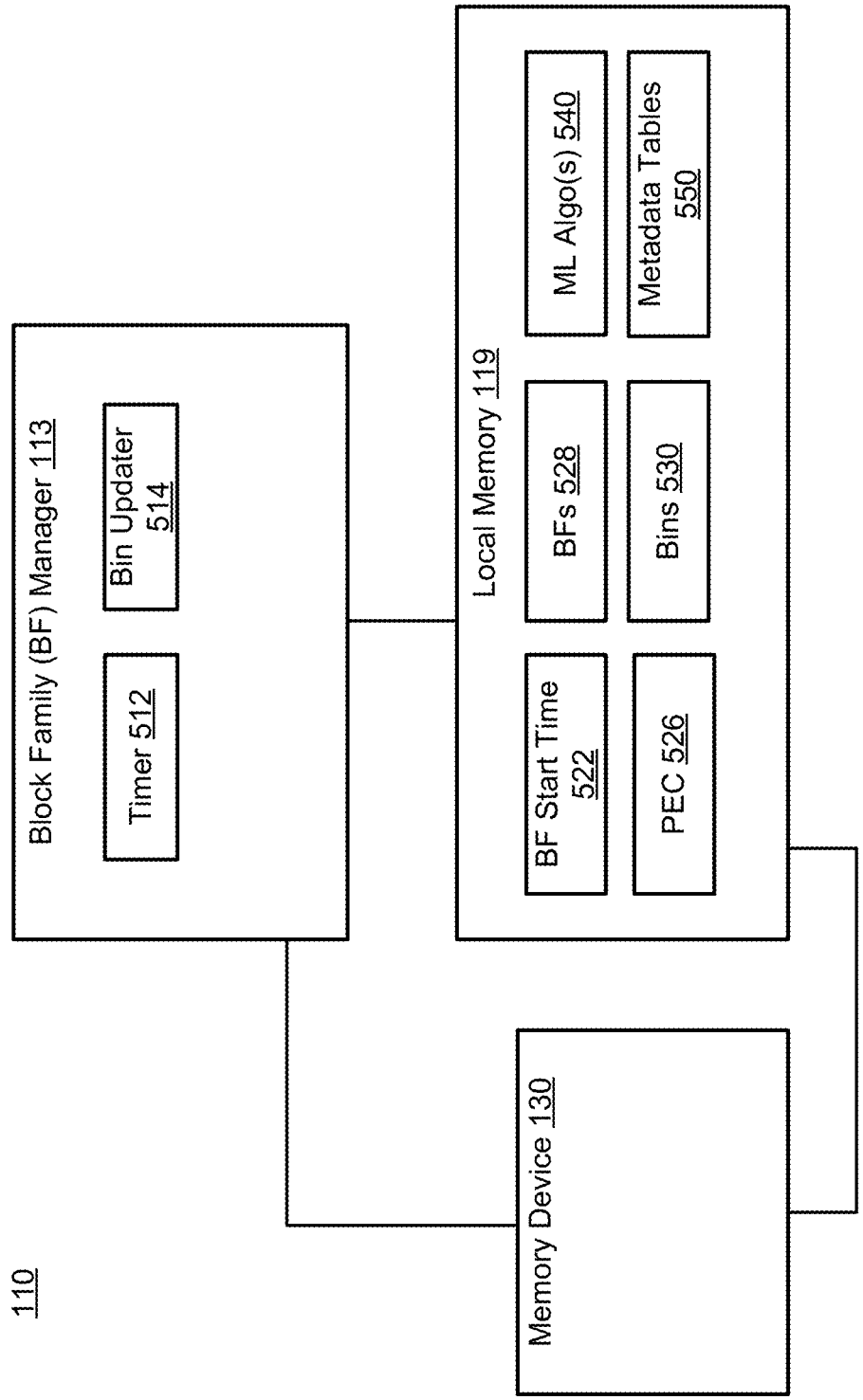
FIG. 5 is a block diagram that illustrates operation of a block family manager within the memory sub-system controller of FIG. 1 in accordance with various embodiments.

FIG. 5 is a block diagram that illustrates operation of the block family manager 113 within the memory sub-system controller 115 of FIG. 1 in accordance with various embodiments. In various embodiment, the block family manager 113 can include a timer 512 and a bin updater 514 among other components or modules to perform functionality of the block family (BF) manager 113 will be discussed with reference to managing and tracking block families throughout this disclosure. In some embodiments, the timer 512 is located outside of the BF manager 113 (e.g., in the processor 117) and is accessed for use by the BF manager 113. The local memory 119 can store a number of different items of information or data that will be discussed in more detail, including but not limited to, a block family (BF) start time 522, a tracked number of program-erase cycles or PEC 526, identified BFs 528, identified threshold voltage offset bins, e.g., multiple bins 530, one or more machine learning (ML) algorithm(s) 540, and a set of metadata tables 550. Recall that each of the multiple bins 530 includes a corresponding window of time after program (TAP) of data to the memory device 130.

More specifically, in various embodiments, the block family manager 113 can open a new block family after a previously block family has been closed. At initiation of the block family, the block family manger 113 can initialize the timer 512 associated with a system clock. The system clock, for example, can be a clock maintained by the memory sub-system 110 and/or the host system 120. The time at which the block family is opened on the system clock can be stored as the BF start time 522. The TAP discussed above can be based off of the BF start time for each respective block family and can also be tracked at the LUN, or logical block, level within the BF as well.

As time passes, in creating a number of block families, the memory device 130 also ages, as the memory cells undergo many program-erase cycles (PEC). The PEC refers to the number of times a group of memory cells is erased and subsequently programmed with new data. The BF manager 113 can keep track of the total number of PEC 526, e.g., within the local memory 119. The BF manager 113 can track the total number of PEC 526 by tracking a representative number of the PEC across the multiple dice of the memory device 130. The representative number of PEC, for example, can be an average, a median, mean, maximum, minimum or the like value for PEC calculated across the dice of the memory device 130. In other embodiments, the BF manager 113 can track the PEC at individual die of the multiple dice of the memory device 130.

In various embodiments, if the bin updater 514 determines the number of PEC satisfies a first threshold criterion, such as being greater than or equal to a threshold number of PEC, the bin updater 514 can add an additional threshold voltage offset bin to the multiple bins 530. The threshold number of PEC can be, for example, 500, 1,000, 5,000 or some other value depending on how often the multiple bins 530 are to be updated based on an increasing number of PEC.

In at least a first embodiment, the bin updater 514 tacks on the additional threshold voltage offset bin as an oldest of the multiple bins 530, e.g., such that the corresponding window of time of the additional threshold voltage offset bin is older than that of the other threshold voltage offset bins. In this first embodiment, bin updater 514 also re-identifies the oldest block family (and other sufficiently old BFs) of the BFs 528 with the additional threshold voltage offset bin depending on the threshold voltage offset levels needed for use by these BFs. The re-identification can be based on a measured temporal voltage shift of the oldest block family (or families) compared to a threshold voltage offset associated with the additional threshold voltage offset bin. In this way, other unaffected BFs need not be re-identified with any new threshold voltage offset bin.

In at least a second embodiment, the bin updater 514 tacks on the additional threshold voltage offset bin as a youngest of the multiple bins 530, e.g., such that the corresponding window of time of the additional threshold voltage offset bin is younger than that of the other threshold voltage offset bins. In the second embodiment, the bin updater 514 re-identifies the youngest block family (and other sufficiently young BFs) of the BFs 528 with the additional threshold voltage offset bin depending on the threshold voltage offset levels needed for use by these BFs. The re-identification can be based on a measured temporal voltage shift of the youngest block family (or families) compared to a threshold voltage offset associated with the additional threshold voltage offset bin. Alternatively, the controller 115 can partition in two the pre-existing youngest threshold voltage offset bin (e.g., Bin 1 in FIG. 4A) with the additional threshold offset bin being identified as the youngest of the two. The youngest BFs can then be re-identified with (or re-assigned to) the additional threshold voltage offset bin for performance of read operations. Advantageously, such re-identification is unnecessary for BFs that remain properly identified (or assigned to) a pre-existing threshold voltage offset bin of the multiple bins 530.

In a related embodiment, the above various embodiments can be extended to include at least one additional trigger point for PEC causing the addition of yet another additional threshold voltage offset bin. For example, in response to the representative number of program-erase cycles satisfying a second threshold criterion, which is greater than the first threshold criterion, the bin updater 514 can add a second threshold voltage offset bin to the threshold voltage offset bins, e.g., the multiple bins 530. The second threshold criterion, for example, can be a second threshold number of PEC that is greater than the first threshold number. As with the first additional threshold voltage offset bin, the second threshold voltage offset bin can be tacked on to be the oldest of the multiple bins 530 or be tacked onto the youngest of the multiple bins 530 where aged is judged according to TAP. Thus, the second additional threshold voltage offset bin can be older than the first additional threshold voltage offset bin. One or more of the existing BFs 528 can be re-identified with (or re-assigned to) the second additional threshold voltage offset bin.

In an alternative or additional embodiment, the bin updater 514 can increase the multiple threshold voltage offsets of each of the multiple bins 530 by a first amount (e.g., number of millivolts), thus performing dynamic bin placement for the multiple bins 530, also in response to the bin updater 514 determining the number of PEC satisfies the first (or second) threshold criterion. The increase, for example, can be to increase a representative read level (e.g., read level 7, also referred to as V7) of each of the threshold voltage offset bins by between 1-3 DACs, e.g., between 10 and 30 millivolts. In another embodiment, the magnitude of the increase is adjusted, e.g., to between 31 and 60 millivolts. Other increases in magnitude of the threshold voltage offset levels are envisioned.

In a still further embodiment, the bin updater 514 can alternatively determine a number of program-erase cycles (PEC) performed across multiple dice of a memory device 130, including how many PEC are performed at each individual die of the memory device 130. The bin updater 514 can further execute, based on the number of program-erase cycles performed at a die, a machine learning algorithm (e.g., of the one or more ML algorithm(s) 540) to determine multiple threshold voltage offset bins with which to associate BFs of the memory device. The machine learning can also seek to reduce trigger margin loss associated with use of threshold voltage offsets corresponding to the threshold voltage offset bins. Trigger margin loss is loss of trigger margin, which is a ratio of bit error rate, at a critical trigger rate, and a maximum bit error rate that is correctable at that critical trigger rate. The critical trigger rate is a number of codewords that are not correctable when read outside of error handling.

In related embodiments, the bin updater 514 can track a total number of program-erase cycles performed across the multiple dice of the memory device over time. The bin updater 514 can also continuously update the threshold voltage offset bins by executing the machine learning algorithm based on the total number of PEC that are tracked over time performed at the die of the multiple dice. In this way, the threshold voltage offset bins associated with the multiple bins 530 can be dynamically adjusted continuously for better RBER at the edges of the multiple bins 530.

Figure 6:
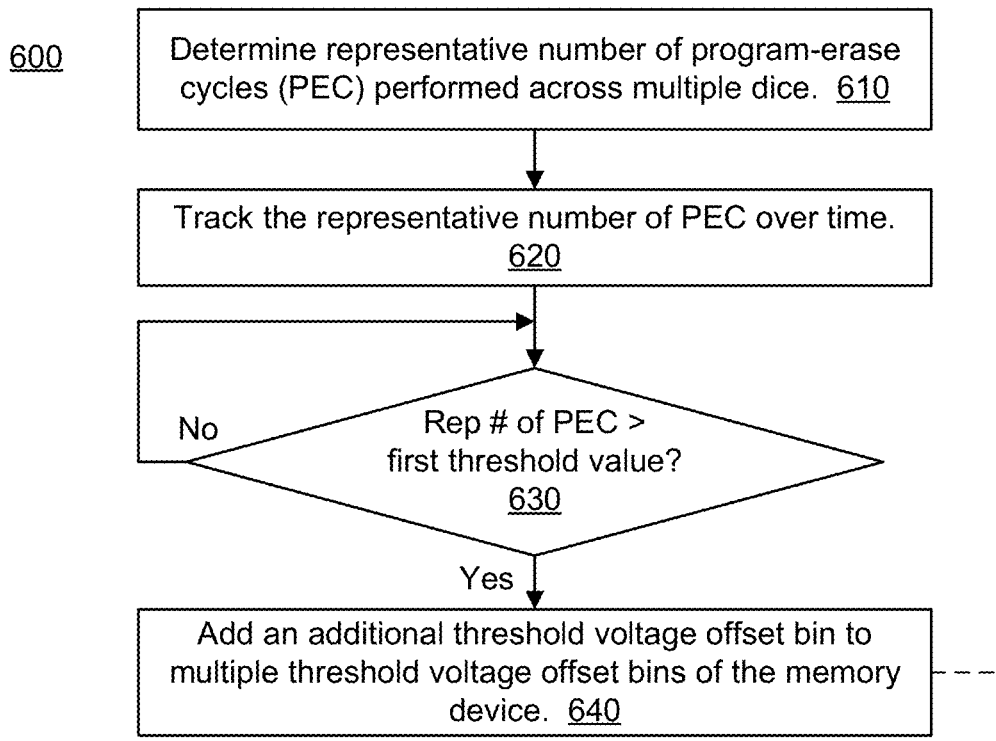
FIG. 6 is a flow diagram of an example method for adjusting a number of threshold voltage offset bins, in accordance with some embodiments.

FIG. 6 is a flow diagram of an example method 600 for adjusting a number of threshold voltage offset bins, in accordance with some embodiments. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the block family manager 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 610, the processing logic determines a representative number of program-erase cycles performed across multiple dice of the memory device, e.g., memory device 130. The representative number of PEC, for example, can be an average, a median, mean, maximum, minimum or the like value for PEC calculated across the dice of the memory device 130.

At operation 620, the processing logic tracks the representative number of program-erase cycles over time. This tracking can be performed in order to know when certain threshold criterion are met for adjustment of the multiple threshold voltage offset bins.

At operation 630, the processing logic determines whether the representative number of PECs satisfies a first threshold criterion, such as being greater than a first threshold value. The threshold number of PEC can be, for example, 500, 1,000, 5,000 or some other value depending on how often the multiple bins 530 are to be updated based on an increasing number of PEC.

If the representative number of PEC is greater than the first threshold criterion (or value), at operation 640, the processing logic adds an additional threshold voltage offset bin to multiple threshold voltage offset bins for the memory device. Each of the threshold voltage offset bins can include a corresponding window of time after program of data to the memory device. In some embodiments, the additional threshold voltage offset bin is tacked onto the multiple bins 530 as the oldest (or the youngest) of the multiple bins 530 as was previously discussed.

Figure 7:
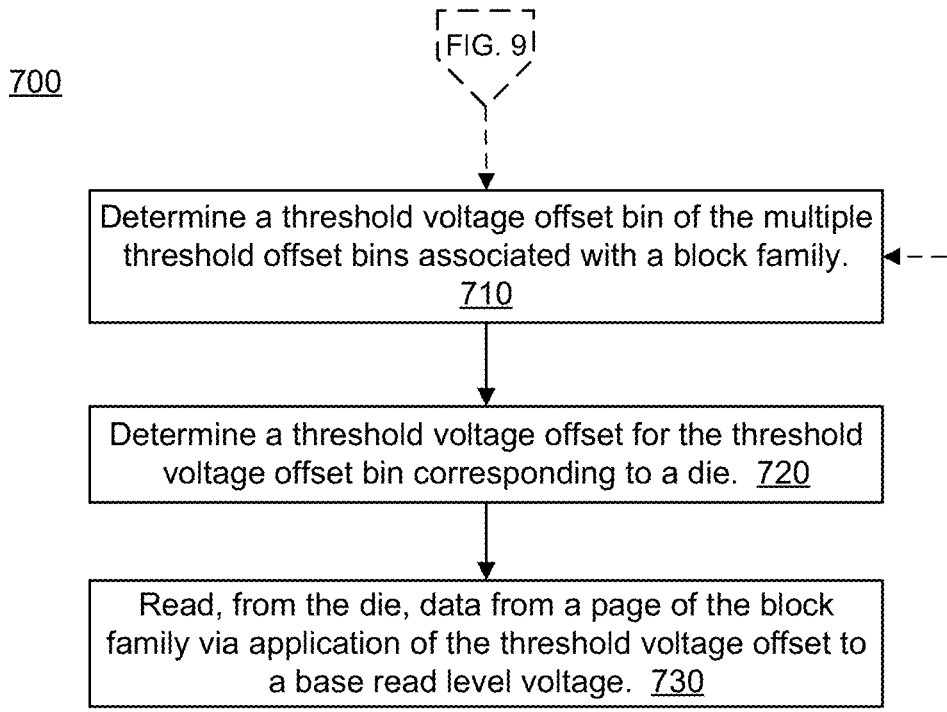
FIG. 7 is a flow diagram of an example method for employing threshold voltage offset bins to perform a read operation, in accordance with some embodiments.

FIG. 7 is a flow diagram of an example method 700 for employing threshold voltage offset bins to perform a read operation, in accordance with some embodiments. The method 700 can be an extension to the methods 600 and 800. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the block family manager 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 710, the processing logic determines a threshold voltage offset bin of the multiple threshold offset bins associated with a block family. As will be discussed in more detail with reference to FIG. 8, the threshold voltage offset bin can be determined via access to an indexed pointer within a block family table referenced by the block family.

At operation 720, the processing logic determines a threshold voltage offset for the threshold voltage offset bin corresponding to a die of multiple dice of the memory device. As will be explained in more detail with reference to FIG. 8, the selected threshold voltage offset bin is linked to one or more threshold voltage offset levels between metadata tables, which the processing uses to determine the trim value to add to a base read level voltage.

At operation 730, the processing logic reads, from the die, data from a page of the block family via application of the threshold voltage offset to a base read level voltage. This addition can be a cumulative adjustment to the threshold voltage offset, where additional adjustments can be made based on a temperature metric (e.g., aggregate temperature value) or other data metric value associated with the block family.

FIG. 8 is a graph 800 that schematically illustrates metadata maintained by the memory sub-system controller operating in according with some embodiments. The metadata can be maintained for associating LUNs (e.g., blocks) or partial LUNs (e.g., codewords or pages) with block families. As schematically illustrated by FIG. 8, the memory sub-system controller can maintain a superblock table 810, a block family table 820, and a bin offset table 830 of the metadata tables 550. A superblock is a set of blocks that span multiple dice that are written in an interleaved fashion. In some cases, a superblock can span all the dice within the memory device 130. A superblock can contain multiple data blocks from a single die, such as one per plane.

Each record of the superblock table 810 specifies the block family associated with the specified superblock and partition combination. In some implementations, records of the superblock table 810 can further include time and temperature values associated with the specified superblock and partition combination.

The block family table 820 is indexed by the block family number, such that each record of the block family table 820 specifies, for the block family referenced by the index of the record, a set of threshold voltage offset bins (e.g., bin pointers) associated with respective dies of the block family. In other words, each record of the block family table 820 includes a vector, each element of which specifies the threshold voltage offset bin associated with the die referenced by the index of the vector element. In one embodiment, all the dice of a plurality of dice in the memory device 130 point to a single bin. The threshold voltage offset bins to be associated with the block family dies can be determined by the calibration process, as described in more detail herein.

Further, the bin offset table 830 is indexed by the bin number. Each record of the bin offset table 830 specifies a set of threshold voltage offsets (e.g., for TLC, MLC, and/or SLC) associated with threshold voltage offset bin. In various embodiments, when the bin updater 514 adds a threshold voltage offset bin (FIG. 6), the bin updater 514 adds the additional threshold voltage offset bin to the bin offset table 830. In this way, the additional threshold voltage offset bin can be associated with threshold voltage offsets different from the pre-existing threshold voltage offset bins in at least some respects, as discussed herein. Additionally, when the threshold voltage offsets themselves are adjusted (FIG. 9), the bin updater 514 can adjust the values for the threshold voltage offsets for the multiple threshold voltage offset bins in the bin offset table 830.

In disclosed embodiments, the bin updater 514 can then update the bin pointers of the block family table 820 as appropriate for the oldest (or youngest) block families to point to the additional threshold voltage offset bin in the bin offset table 830, depending on whether the first or second embodiment is performed that was discussed with reference to FIG. 5. To re-identify a block family with the additional threshold voltage offset bin, the bin updater 514 can update the block family table 820 to point to a new threshold voltage offset bin containing new threshold voltage offset values, e.g., to be used for performance of a read operation.

The metadata tables 810-830 can be stored on one or more memory devices 130 of FIG. 1. In some implementations, at least part of the metadata tables 810-830 can be cached in the local memory 119 of the memory sub-system controller 115 of FIG. 1, e.g., as part of the metadata tables 550 (FIG. 5).

In operation, upon receiving a read command, the memory sub-system controller determines the physical address corresponding to the logical block address (LBA) specified by the read command. Components of the physical address, such as the physical block number and the die identifier, are utilized for performing the metadata table walk. For example, the superblock table 810 is first used to identify the block family identifier corresponding to the physical block number. Next, the block family identifier is used as the index to the block family table 820 in order to determine the threshold voltage offset bin associated with the block family and the die. Finally, the identified threshold voltage offset bin is used as the index to the bin offset table 830 in order to determine the threshold voltage offset corresponding to the identified threshold voltage offset bin. The memory sub-system controller can then additively apply the identified threshold voltage offset to the base voltage read level in order to perform the requested read operation.

In the illustrative example of FIG. 8, the superblock table 810 maps partition 0 of the superblock 0 to block family 4, which is utilized as the index to the block family table 820 in order to determine that die 0 is mapped to bin 3. The latter value is used as the index to the offset table in order to determine the threshold voltage offset values for bin 3. Not all values likely contained in the metadata tables 810-830 are illustrated for simplified illustration.

Figure 9:
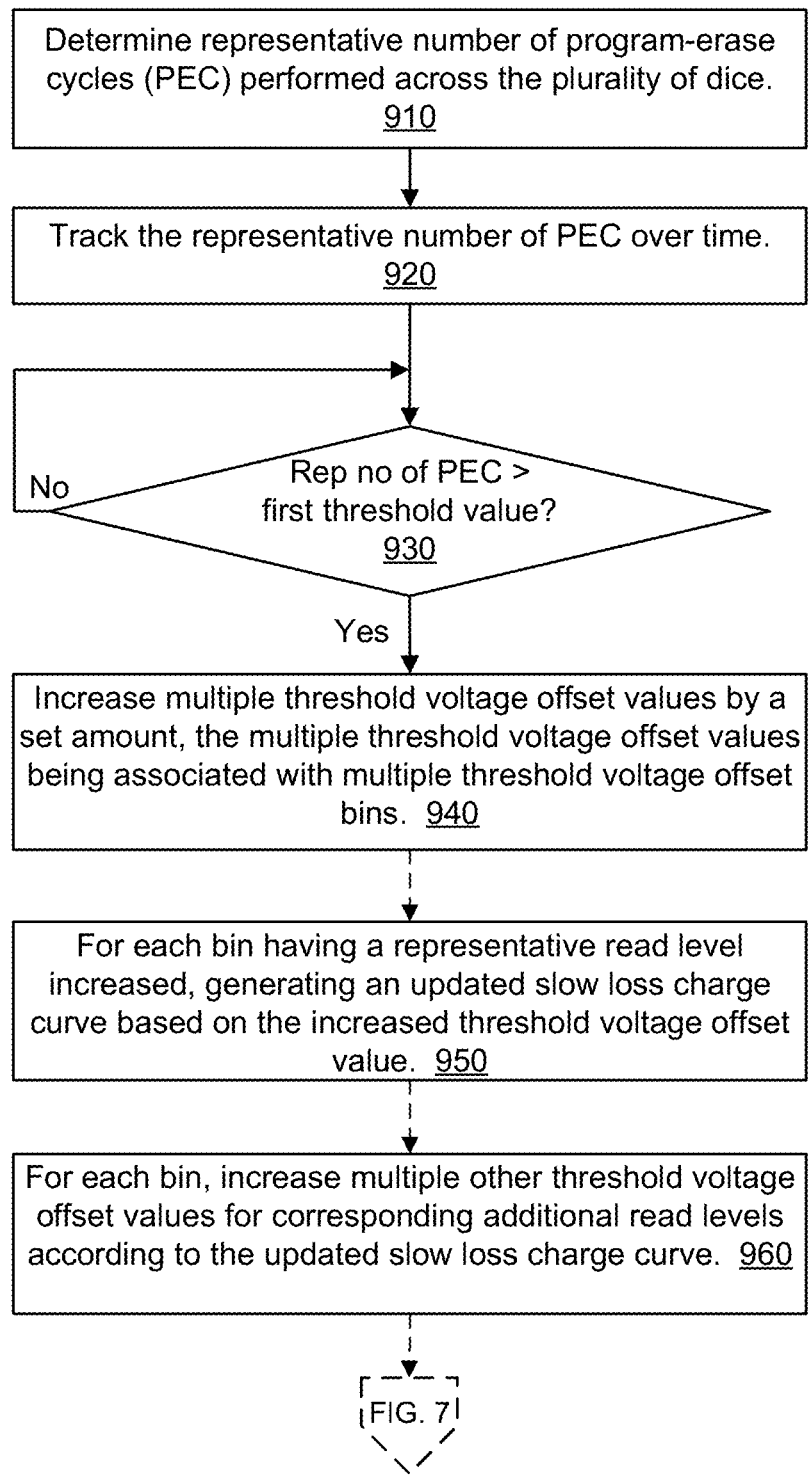
FIG. 9 is a flow diagram of an example method for adjusting a placement of threshold voltage offsets with threshold voltage offset bins, in accordance with some embodiments.

FIG. 9 is a flow diagram of an example method 900 for adjusting a placement of threshold voltage offsets with threshold voltage offset bins, in accordance with some embodiments. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the block family manager 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 910, the processing logic determines a representative number of program-erase cycles performed across multiple dice of the memory device, e.g., memory device 130. The representative number of PEC, for example, can be an average, a median, mean, maximum, minimum or the like value for PEC calculated across the dice of the memory device 130.

At operation 920, the processing logic tracks the representative number of program-erase cycles over time. This tracking can be performed in order to know when certain threshold criterion are met for adjustment of the multiple threshold voltage offset bins.

At operation 930, the processing logic determines whether the representative number of PECs satisfies a first threshold criterion, such as being greater than a first threshold value. The threshold number of PEC can be, for example, 500, 1,000, 5,000 or some other value depending on how often the multiple bins 530 are to be updated based on an increasing number of PEC.

If the representative number of PEC is greater than the first threshold criterion (or value), at operation 940, the processing logic increases multiple threshold voltage offset values by a first amount (e.g., certain number of millivolts). The multiple threshold voltage offset values are associated with multiple threshold voltage offset bins. Each of the multiple threshold offset bins include a corresponding window of time after program of data to the memory device. In one embodiment, the increasing includes increasing a representative read level for each of the multiple threshold voltage offset bins by between 10 and 30 millivolts, or some other similar range.

In a further embodiment, in response to the representative number of program-erase cycles satisfying a second predetermined threshold criterion, which is larger than the first threshold criterion, the processing logic increases the threshold voltage offsets by a second amount that is larger than the first amount. This increasing can include increasing the representative read level for each of the multiple threshold voltage offset bins by between 31 and 60 millivolts, or some other similar range.

At operation 950, for each bin having a threshold voltage offset value increased, the processing logic generates an updated slow loss charge curve based on the increased threshold offset value. This updated slow loss charge curve can inform other read level values of the threshold voltage offset bin.

At operation 960, the processing logic further, for each bin, increases multiple other threshold voltage offset values for corresponding additional read levels according to the updated slow charge loss curve. In these embodiments, if one threshold voltage offset value (e.g., for read level 7 as an example) is increased within a threshold voltage offset bin, then the other threshold voltage offset values of that bin (e.g., read levels 1, 2, 3, . . . 6) are updated appropriately in accordance with a slow charge loss curve where read level 7 experiences this increased threshold voltage offset value. In this way, the other threshold voltage offsets for the bin are appropriately calibrated off of the updated threshold voltage offset value for read level 7 in this embodiment.

In alternative, or additional, embodiments the metadata tables 550 include multiple versions of the bin offset table 830 (FIG. 8), each with varying numbers of threshold voltage offset bins and/or varying threshold voltage offset values for the various read levels of each of the threshold voltage offset bins in the bin offset table 830. Use of the bin offset tables 830 can be rotated depending on a value or range of the values for PEC of the memory device 130. Thus, each different bin offset table 830 can be pre-populated with a number of threshold voltage offset bins and corresponding threshold voltage offset values for the read levels of bin that address increasing level over PEC over time. The PEC can increase beyond a K value, for instance.

For example, after the PEC satisfies (e.g., meets) the first threshold criterion (e.g., K<PEC<N), then the processing device can load an updated bin offset table from the local memory 119. The updated bin offset table can include the additional threshold voltage offset bin (operation 640 of FIG. 6) and/or updated threshold voltage offset values of the threshold voltage offset bins (operations 940-960 of FIG. 9). The processing logic can further re-synchronize pointers of block families to corresponding ones of the threshold voltage offset bins of the updated bin offset table, e.g., based on measured TVS levels through scanning as we previously discussed.

As an extension of this embodiment, the processing logic can further determine that the representative number of program-erase cycles (PEC) at least satisfies a second threshold criterion (e.g., PEC>N). The processing logic can further load a second updated bin offset table from the local memory 119, the second updated bin offset table including at least a second additional voltage offset bin and further updated threshold voltage offset values of the threshold voltage offset bins. The processing logic can further re-synchronize pointers of the block families to corresponding ones of the threshold voltage offset bins of the second updated bin offset table. Additional bin offset tables 830 are envisioned for corresponding additional PEC ranges.

Figure 10:
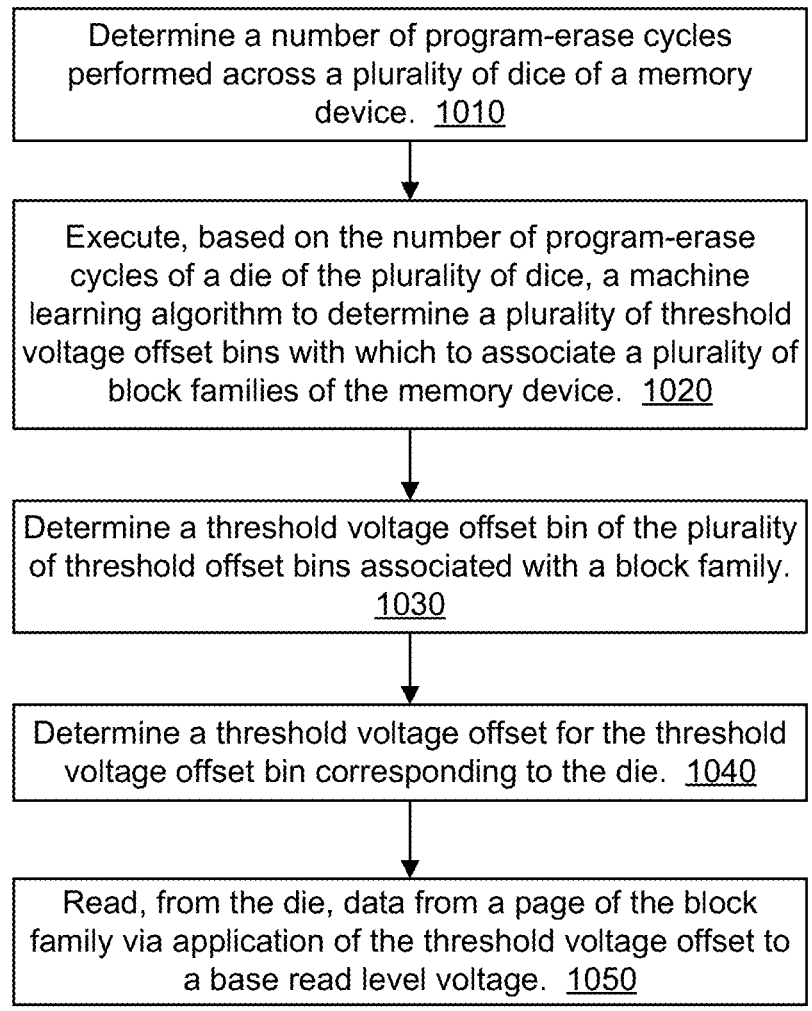
FIG. 10 is a flow diagram of an example method of employing machine learning to establish the threshold voltage offset bins of the memory device in accordance with various embodiments.

FIG. 10 is a flow diagram of an example method 1000 of employing machine learning to establish the threshold voltage offset bins of the memory device in accordance with various embodiments. The method 1000 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1000 is performed by the block family manager 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 1010, the processing logic determines a number of program-erase cycles performed across multiple dice of a memory device. The processing logic can also, in a further embodiment, continuously track a total number of program-erase cycles performed across the dice of the memory device over time.

At operation 1020, the processing logic executes, based on the number of program-erase cycles performed at a die, a machine learning algorithm to determine multiple threshold voltage offset bins with which to associate multiple block families of the memory device. In some embodiments, the machine learning algorithm works to reduce trigger margin loss associated with use of threshold voltage offsets corresponding to the threshold voltage offset bins. The trigger margin loss is loss of trigger margin, which is a ratio of bit error rate, at a critical trigger rate, and a maximum bit error rate that is correctable at that critical trigger rate. Further, the critical trigger rate is a number of codewords that are not correctable when read outside of error handling. In one embodiment, the processing logic alternatively (or additionally) determines a composite trigger metric that includes a combination of the critical trigger rate and the trigger margin loss. In this case, the processing logic determines, using the machine learning algorithm, the multiple threshold voltage offset bins such as to reduce the composite trigger metric.

In various embodiments, execution of the machine learning algorithm is to determine the multiple threshold offset bins by one of adjusting the window of time after program for at least some of the multiple threshold voltage offset bins (to include optionally adding one or more threshold voltage offset bin) or increasing a magnitude of threshold voltage offsets of corresponding ones of at least some of the multiple threshold voltage offset bins. This multi-factor learning approach can work to improve the TAP location of a particular set of the multiple bins and the magnitude of the threshold voltage offsets associated with the multiple bins, thus potentially significantly improving the trigger margin loss and reducing RBER.

In the further embodiment, the processing logic continuously updates the multiple threshold voltage offset bins by executing the machine learning algorithm based on the total number of program-erase cycles that are tracked over time performed at the die of the multiple dice. In this way, the method 1000 can be performed continuously as the PEC is tracked over time to continuously learn and improve upon the number of (or placement of) threshold voltage offset bins and the threshold voltage offsets associated with those bins.

At operation 1030, the processing logic determines a threshold voltage offset bin of the multiple threshold offset bins associated with a block family. The processing logic can determine the threshold voltage offset bin via access to an indexed pointer within the block family table 820, for example.

At operation 1040, the processing logic determines a threshold voltage offset for the threshold voltage offset bin corresponding to the die. As is explained in more detail with reference to FIG. 8, the selected threshold voltage offset bin is linked to one or more threshold voltage offset levels between metadata tables, which the processing uses to determine the threshold voltage offset (or trim value) to add to a base read level voltage.

At operation 1050, the processing logic reads, from the die, data from a page of the block family via application of the threshold voltage offset to a base read level voltage. This addition can be a cumulative adjustment to the threshold voltage offset, where additional adjustments can be made based on a temperature metric (e.g., aggregate temperature value) or other data metric value associated with the block family.

Figure 11:
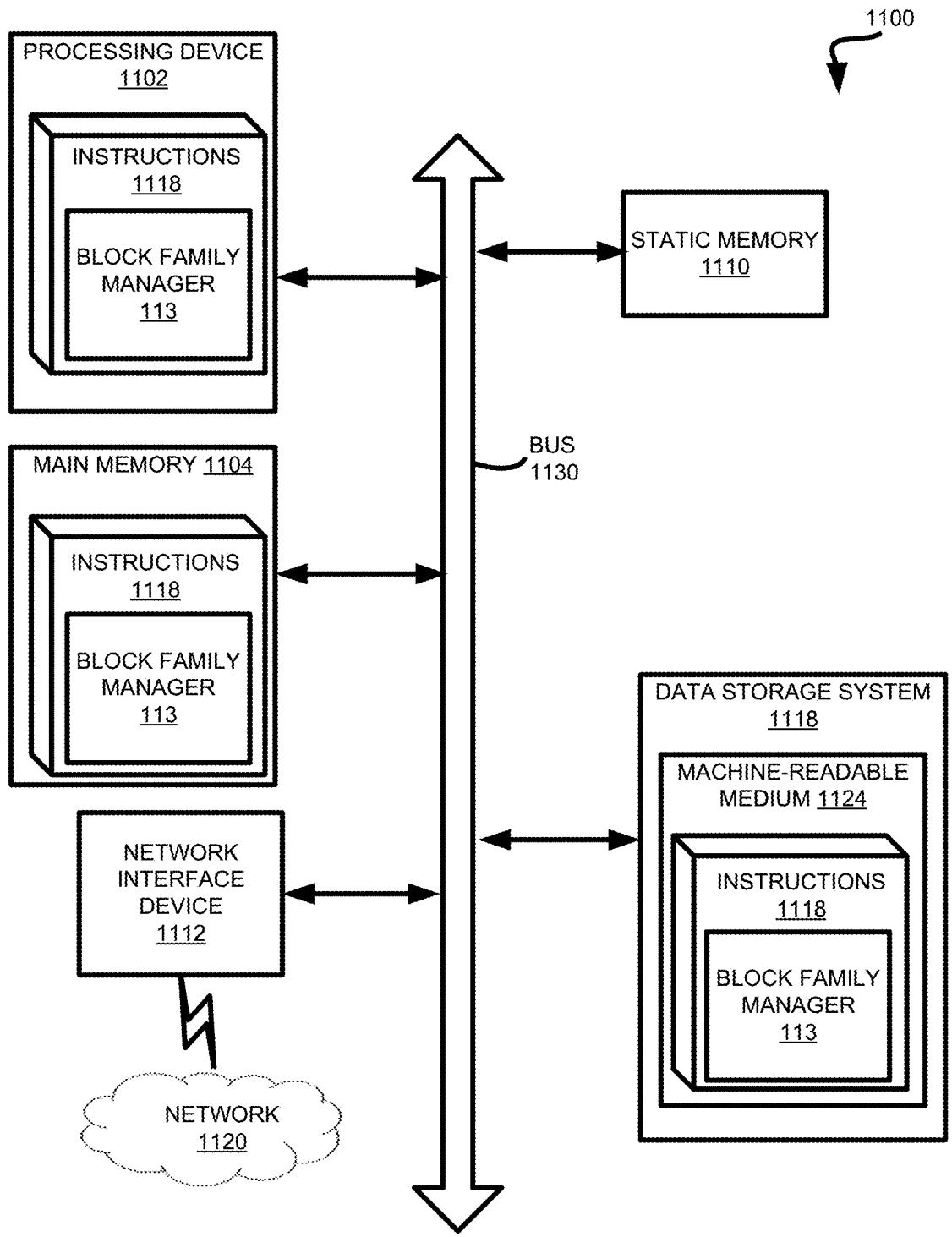
FIG. 11 is a block diagram of an example computer system in which embodiments of the present disclosure can operate.

FIG. 11 illustrates an example machine of a computer system 1200 within which a set of instructions, for causing the machine to perform any one or more of the methodologies discussed herein, can be executed. In some embodiments, the computer system 1100 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the block family manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM) or Rambus DRAM (RDRAM), etc.), a static memory 1110 (e.g., flash memory, static random access memory (SRAM), etc.), and a data storage system 1118, which communicate with each other via a bus 1130.

Processing device 1102 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 can also be one or more special-purpose processing devices such as an application specific integrated circuit (ASIC), a field programmable gate array (FPGA), a digital signal processor (DSP), network processor, or the like. The processing device 1102 is configured to execute instructions 1128 for performing the operations and steps discussed herein. The computer system 1100 can further include a network interface device 1112 to communicate over the network 1120.

The data storage system 1118 can include a machine-readable storage medium 1124 (also known as a computer-readable medium) on which is stored one or more sets of instructions 1128 or software embodying any one or more of the methodologies or functions described herein. The instructions 1128 can also reside, completely or at least partially, within the main memory 1104 and/or within the processing device 1102 during execution thereof by the computer system 1100, the main memory 1104 and the processing device 1102 also constituting machine-readable storage media. The machine-readable storage medium 1124, data storage system 1118, and/or main memory 1104 can correspond to the memory sub-system 110 of FIG. 1.

In one embodiment, the instructions 1128 include instructions to implement functionality corresponding to the block family manager 113 of FIG. 1. While the machine-readable storage medium 1124 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device comprising a plurality of dice; and
a processing device, operatively coupled to the memory device, the processing device to perform operations comprising:
tracking a representative number of program-erase cycles over time; and
in response to the representative number of program-erase cycles satisfying a first threshold criterion, modifying a number of threshold voltage offset bins for the memory device, wherein each of the threshold voltage offset bins is associated with a corresponding window of time after program of data to the memory device.

2. The system of claim 1, wherein modifying the number of threshold voltage offset bins comprises adding an additional threshold voltage offset bin to the number of threshold voltage offset bins, and wherein the corresponding window of time of the additional threshold voltage offset bin is older than that of the threshold voltage offset bins.

3. The system of claim 2, wherein the operations further comprise re- identifying at least an oldest block family of a plurality of block families with the additional threshold voltage offset bin based on a measured temporal voltage shift of the oldest block family compared to a threshold voltage offset associated with the additional threshold voltage offset bin.

4. The system of claim 2, wherein the operations further comprise selecting, for performing block read operations of an oldest block family, the additional threshold voltage offset bin.

5. The system of claim 1, wherein modifying the number of threshold voltage offset bins comprises adding an additional threshold voltage offset bin to the number of threshold voltage offset bins, comprising:
loading an updated bin offset table from a local memory, the updated bin offset table comprising the additional threshold voltage offset bin and updated threshold voltage offset values of the threshold voltage offset bins; and
re-synchronizing pointers of block families to corresponding ones of the threshold voltage offset bins of the updated bin offset table.

6. The system of claim 5, wherein the operations further comprise:
determining that the representative number of program-erase cycles at least satisfies a second threshold criterion;
loading a second updated bin offset table from the local memory, the second updated bin offset table comprising at least a second additional voltage offset bin and further updated threshold voltage offset values of the threshold voltage offset bins; and
re-synchronizing the pointers of the block families to corresponding ones of the threshold voltage offset bins of the second updated bin offset table.

7. The system of claim 5, wherein, in response to the representative number of program-erase cycles satisfying a second threshold criterion, which is greater than the first threshold criterion, the operations further comprise adding a second additional threshold voltage offset bin to the threshold voltage offset bins.

8. The system of claim 7, wherein the corresponding window of time of the second additional threshold voltage offset bin is older than that of the additional threshold voltage offset bin.

9. A method comprising:
tracking, by a processing device, a representative number of program-erase cycles performed across a plurality of dice of a memory device; and
in response to the representative number of program-erase cycles satisfying a first threshold criterion, modifying, by the processing device, each of a plurality of threshold voltage offset values by a first amount, wherein the plurality of threshold voltage offset values are associated with a plurality of threshold voltage offset bins, and each of the plurality of threshold voltage offset bins comprises a corresponding window of time after program of data to the memory device.

10. The method of claim 9, wherein modifying the plurality of threshold voltage offset values comprises increasing a representative read level for each of the plurality of threshold voltage offset bins by between 10 and 30 millivolts, the method further comprising, for each bin having the representative read level increased:
generating an updated slow loss charge curve based on the increased threshold voltage offset value; and
increasing multiple other threshold voltage offset values for corresponding additional read levels according to the updated slow loss charge curve.

11. The method of claim 9, further comprising, in response to the representative number of program-erase cycles satisfying a second predetermined threshold criterion, which is larger than the first threshold criterion, increasing the threshold voltage offset values by a second amount that is larger than the first amount.

12. The method of claim 11, wherein modifying the plurality of threshold voltage offset values comprises increasing a representative read level for each of the plurality of threshold voltage offset bins by between 31 and 60 millivolts, the method further comprising, for each bin having the representative read level increased:
generating an updated slow loss charge curve based on the increased threshold voltage offset value; and
increasing multiple other threshold voltage offset values for corresponding additional read levels according to the updated slow loss charge curve.

13. The method of claim 9, further comprising adding an additional threshold voltage offset bin to the plurality of threshold voltage offset bins, the additional threshold voltage offset bin comprises a corresponding window of time that is older than that of the plurality of threshold voltage offset bins.

14. The method of claim 13, further comprising re-identifying at least an oldest block family of a plurality of block families with the additional threshold voltage offset bin based on a measured temporal voltage shift of the oldest block family compared to a threshold voltage offset associated with the additional threshold voltage offset bin.

15. The method of claim 9, further comprising:
   determining a threshold voltage offset bin of the plurality of threshold voltage offset bins associated with a block family of a plurality of block families of the memory device;
   determining a threshold voltage offset for the threshold voltage offset bin corresponding to a die of the plurality of dice; and
   reading, by the processing device from the die, data from a page of the block family via application of the threshold voltage offset to a base read level voltage.

16. A method comprising:
   operating a memory device comprising a plurality of dice, wherein operating the memory device comprises:
      executing, by a processing device and based on a number of program-erase cycles performed at a die of the plurality of dice, a machine learning algorithm to determine a plurality of threshold voltage offset bins with which to associate a plurality of block families of the memory device and that reduces trigger margin loss associated with use of threshold voltage offsets corresponding to the plurality of threshold voltage offset bins;
      determining, by the processing device, a threshold voltage offset for a threshold voltage offset bin of a block family corresponding to the die; and
      reading, by the processing device from the die, data of the block family via application of the threshold voltage offset to a base read level voltage.

17. The method of claim 16, further comprising:
   tracking a total number of program-erase cycles performed across the plurality of dice of the memory device over time; and
   continuously updating the plurality of threshold voltage offset bins by executing the machine learning algorithm based on the total number of program-erase cycles that are tracked over time performed at the die of the plurality of dice.

18. The method of claim 16, wherein the trigger margin loss comprises loss of trigger margin, which is a ratio of bit error rate, at a critical trigger rate, and a maximum bit error rate that is correctable at that critical trigger rate, wherein the critical trigger rate comprises a number of codewords that are not correctable when read outside of error handling.

19. The method of claim 18, further comprising:
   determining a composite trigger metric comprising a combination of the critical trigger rate and the trigger margin loss; and
   determining, using the machine learning algorithm, the plurality of threshold voltage offset bins such as to reduce the composite trigger metric.

20. The method of claim 16, wherein each of the plurality of threshold voltage offset bins corresponds to a window of time after program of data to the memory device, and wherein executing the machine learning algorithm to determine the plurality of threshold voltage offset bins comprises at least one of:
   adjusting the window of time after program for at least some of the plurality of threshold voltage offset bins; or
   increasing a magnitude of threshold voltage offsets of corresponding ones of at least some of the plurality of threshold voltage offset bins.

* * * * *